United States Patent [19]

Rubin

[11] 4,063,186
[45] Dec. 13, 1977

[54] BROADBAND MILLIMETER WAVE AMPLIFIER

[75] Inventor: David Rubin, San Diego, Calif.

[73] Assignee: The United States of America as represented by the Secretary of the Navy, Washington, D.C.

[21] Appl. No.: 622,285

[22] Filed: Oct. 10, 1975

[51] Int. Cl.² .............................................. H03F 3/10
[52] U.S. Cl. ..................................... 330/287; 330/56; 330/61 A; 333/98 R
[58] Field of Search ................. 329/161, 162; 330/4.9, 330/5, 34, 56, 61 A; 333/7 D, 98 R; 331/107 G

[56] References Cited
U.S. PATENT DOCUMENTS 3,681,718 8/1972 Kozul et al. ...................... 329/162 X
3,775,701 11/1973 Dickens ............................ 330/34 X Primary Examiner—Lawrence J. Dahl
Attorney, Agent, or Firm—R. S. Sciascia; G. J. Rubens; H. Fendelman

[57] ABSTRACT

A millimeter wave amplifier having broadband characteristics in which a Gunn diode or other two terminal negative resistance device having an integral heat sink is center mounted in a reduced height waveguide. The heat sink is attached to a mechanism for selectively adjusting its penetration into the waveguide cavity. The introduction of the heat sink into the waveguide cavity creates a discontinuity to the propagation of energy which causes localized waveguide modes other than the dominant mode to exist. The adjustable position of the heat sink allows the reactance due to the introduction of these modes to be variable, proper adjustment resulting in the cancellation of the parasitic reactances inherent in the packaged negative resistance device.

10 Claims, 2 Drawing Figures

BROADBAND MILLIMETER WAVE AMPLIFIER

BACKGROUND OF THE INVENTION

The present invention relates generally to the field of millimeter wave amplifiers and, more particularly, to those devices utilizing negative resistance properties to obtain reflection gain in reduced height waveguides. Previous millimeter wave amplifiers utilizing such devices as Gunn diodes are either narrowband or utilize a coaxial cavity mounted diode which is connected to the waveguide by iris coupling through the coaxial wall. Associated with the diode and its package are certain parasitic reactances such as diode capacity, inductive leads, etc. In order to obtain the maximum bandwidth, it is necessary to provide additional reactive elements to at least partially cancel the effects of the diode parasitics. Previously, these reactive elements took the form of circuit elements such as tuning slugs, located wavelengths or fractional wavelengths from the diode.

SUMMARY OF THE INVENTION

The present invention relates to an improved millimeter wave amplifier utilizing a Gunn diode or other negative resistance device and exhibiting broadband operation not previously achieved in waveguide. In order to obtain maximum bandwidth, the additional reactive elements necessary to cancel the effects of the diode or other negative resistance device parasitics must be positioned as closely to the diode or other device as possible, a condition that becomes increasingly important at the higher microwave or millimeter wave frequencies. The present device provides a means for positioning these additional compensating reactances to close to the diode as is possible. This is accomplished by the introduction of the heat sink of the diode or other negative resistance device into the waveguide cavity. Means are provided for varying the position of the heat sink vertically between the broad walls of the reduced height waveguide. The introduction of the heat sink creates a discontinuity which allows the local propagation of energy modes other than the dominant mode, e.g., evanescent or decaying modes. The stored energy associated with the fields of these modes gives rise to an effective parasitic approximately at the diode's position. Due to the fact that the penetration of the heat sink is adjustable, the reactance created thereby is variable, and the device can easily be tuned to effectuate cancellation of the diode and package parasitics.

The effect of the device is a very pronounced broadening of the frequency range at which amplification takes place, in addition to the advantage of providing the capability of externally varying the gain of the millimeter wave amplifier. The device of the present invention is simpler to construct, easier to model, readily tuneable by external means and provides the steep amplification slopes required for multi stage operation using nonideal circulators.

STATEMENT OF THE OBJECTS OF THE INVENTION

Accordingly, it is the primary object of the present invention to disclose a novel millimeter wave amplifier that has relatively broadband operating characteristics.

It is a further object of the present invention to disclose a millimeter wave amplifier that requires no additional tuning elements (other than the usual back short behind the diode position).

It is a further object of the present invention to disclose a millimeter wave amplifier that is simpler to construct and easier to model than previous broadband millimeter wave amplifiers.

It is a still further object of the present invention to disclose a millimeter wave amplifier that is externally tuneable.

Other objects, advantages and novel features of the invention will become apparent from the following detailed description of the invention when considered in conjunction with the accompanying drawings.

DESCRIPTION OF THE PREFERRED EMBODIMENT

Figure 1:
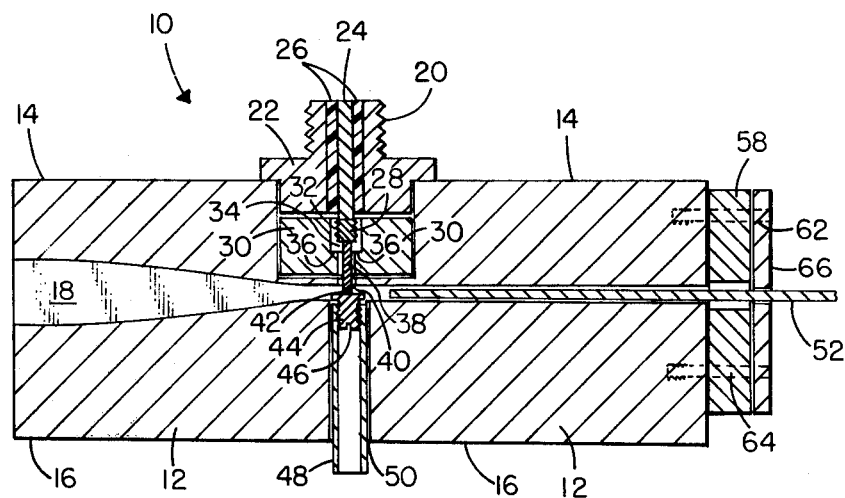
FIG. 1 is a sectional view through one of the side walls of the millimeter wave amplifier of the present invention.
Figure 2:
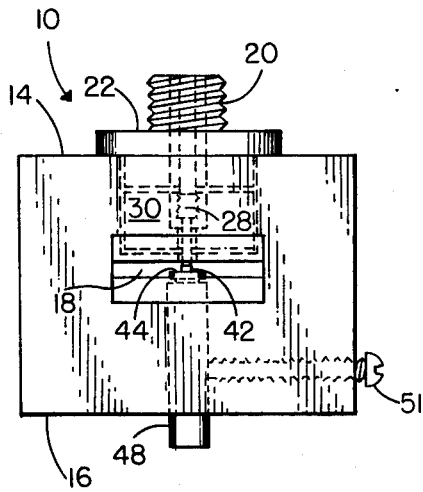
FIG. 2 is a front end view of the millimeter wave amplifier to the present invention.

Referring now to FIGS. 1 and 2, there is illustrated the millimeter wave amplififer 10 of the present invention. The amplifier 10 comprises a reduced height waveguide section 12 illustrated for exemplary purposes as a double cosine tapered waveguide. It is to be understood, however, that other reduced height guides could be used. The waveguide 12 includes top wall 14, bottom wall 16 and waveguide cavity 18. Mounted on the waveguide by suitable means (not shown) is coaxial connector 20 having outer conductor 22 in electrical contact with the waveguide walls and also having inner conductor 24 separated from 22 by insulator 26. The DC input for the two terminal negative resistance device to be described below is inputted through the coaxial connector 20. The inner conductor 24 is electrically connected to compressible gold plated bellows 28. The top of the bellows 28 is mechanically connected to the inner conductor 24 and is secured thereto such that the top portion of the bellows is immovable. Bellows 28 is separated from annular, coaxial spacer 30 by any thin suitable insulator 32 to avoid electrical contact therewith. A space 34 is provided between the bottom of bellows 28 and the top of ledge 36 to provide ample movement room for the bellows 28. Electrically connected to the bottom of bellows 28 is solid cylindrical rod 38 which extends through the inner aperture of the spacer 30 and through the hole 40 in the top wall of the waveguide 12. The conductive rod 38 is mechanically connected to the bellows by any suitable means (not shown) to insure simultaneous movement of the rod and bellows. The bottom of conductive rod 38 is in electrical contact with two terminal negative resistance device 42. 42 is preferably a Gunn diode but it is to be understood that other two terminal negative resistance devices could be used. The rod 38 is maintained in electrical contact with the negative resistance device 42 by the spring-like expansion characteristics of the bellows 28. Thus, no mechanical connection therebetween is necessary. Integral with the two terminal negative resistance device 42 is its cylindrical heat sink 44 which is provided with a threaded outer surface and also a slot 46 across the bottom thereof for use with a screwdriver. The heat sink 44 is mounted within the interior of a hollow, cylindrical, conductive tube 48, the interior portion of which is threaded to mesh with the threading on heat sink 44. Hollow cylindrical tube 48 extends through aperture 50 in the waveguide block and fits snugly therein. Tube 48 is in electrical contact with the metallic heat sink 44 and also the waveguide walls to provide a DC ground for the diode 42. A lock screw 51 extending through the waveguide side wall, or other suitable means may also be provided to secure the position of slidable tube 48. A moveable calibrated shot 52 extends into the waveguide cavity 18 and is used for proper reflection phasing as is well known. A flange spacer 58 mounted to the waveguide by rods 62 and 64 is provided in order to accurately position metal calibrated short 52 behind the diode 42.

Considerable changes in gain and/or bandwidth can be accomplished by simple adjustments of the height of the cylindrical heat sink 44 and short 52 positions without opening the cavity structure. The negative resistance device 42 and integral heat sink 44 may be variably positioned within the cavity 18 by two adjustment mechanisms. First, the moveable diode mount 48 is slideable within aperture 50 such that the negative resistance device 42 and heat sink 44 may be raised or lowered in the cavity 18 by merely sliding the diode mount 48 inwardly or outwardly, respectively. Finer adjustment of the negative resistance device 42 and heat sink 44 position is accomplished by the threaded exterior of the heat sink 44 and the threaded interior of the diode mount 48. As is readily apparent, a screwdriver may be inserted within the cylindrical rod 48 and positioned within the screwdriver slot 46 whereby turning of the screwdriver can effectuate either raising or lowering of the heat sink 44 and negative resistance device 42 in the cavity 18. When the negative resistance device 42 and integral heat sink 44 are lowered by either sliding outwardly the moveable diode mount 48 or by unscrewing the heat sink 44, the compressed bellows 28 expands to maintain conductor 38 in contact with the negative resistance device 42. Similarly, the gold plated bellows 28 compresses when the negative resistance device 42 and integral heat sink 44 are raised higher into the cavity 18 by either of the means described above. It is observed that raising or lowering of the negative resistance device 42 and heat sink 44 by means of the screw mechanism may reorient the negative resistance device 42 within the cavity 18. If it is subsequently desired to return the negative resistance device 42 to its original orientation within the cavity 18, this can be accomplished by rotation of diode mount 48 without changing the depth of penetration of 42 and 44. The introduction of the relatively large cylindrical heat sink 44 into the cavity 18 thus can be used to create a discontinuity which by proper height adjustment, acts to counter the parasitic reactance of the negative resistance device 42 as described above.

Obviously many modifications and variations of the present invention are possible in the light of the above teachings. It is therefore to be understood that within the scope of the appended claims the invention may be practiced otherwise than as specifically described.

What is claimed is:

1. A millimeter wave amplifier comprising:
a reduced height waveguide section having top and bottom walls and a waveguide cavity;
a packaged two terminal negative resistance device having a heat sink integral therewith positioned intermediate said top and bottom walls;
first means secure to said two terminal negative resistance device for externally, selectively adjusting the depth of penetration of said heat sink into said cavity and for presenting said heat sink as a discontinuity to the propagation of energy waves within said cavity such that said heat sink can be positioned within said cavity at any required depth of penetration so as to effectuate cancellation of the parasitic reactances caused by said packaged two terminal negative resistance device.

2. The amplifier of claim 1 wherein said two terminal negative resistance device is a Gunn diode.

3. The amplifier of claim 1 further including connection means for providing a bias voltage to said two terminal negative resistance device; and
second means connecting said connection means to said two terminal negative resistance device for permitting movement of said two terminal negative resistance device and heat sink integral therewith pursuant to said selective adjustment while maintaining contact with said connection means at all times and independently of the depth of penetration of said heat sink into said cavity.

4. The amplifier of claim 3 wherein said second means is a conductive bellows.

5. The amplifier of claim 1 wherein said first means includes second means for rotating the orientation of said two terminal negative resistance device within said cavity.

6. The amplifier of claim 1 wherein:
said waveguide includes an aperture extending through one of the walls thereof; and
said first means comprises a slidable conductive cylinder extending through said aperture and secured to said heat sink.

7. The amplifier of claim 6 wherein said conductive cylinder has a threaded inner surface and said heat sink has a threaded exterior surface engaged therewith, said threaded surfaces enabling said selective adjustment of the depth of penetration of said heat sink into said waveguide cavity.

8. The amplifier of claim 7 wherein said slideable conductive cylinder is rotatable within said aperture.

9. The amplifier of claim 4 wherein said second means further comprises a conductive rod having a first end in contact with said conductive bellows and a second end in contact with said packaged two terminal negative resistance device.

10. In a millimeter wave amplifier including a reduced height waveguide and a packaged two terminal negative resistance device operating within the cavity of said waveguide to achieve a reflection gain, said packaged two terminal negative resistance device having a heat sink integral with the device package, the method of minimizing the parasitic reactances exhibited by the device and its packaging comprising the step of:
adjusting the depth of penetration of said integral heat sink into said waveguide cavity such that said heat sink presents a discontinuity to the propagation of energy waves within said cavity and such that the reactances caused by said discontinuity cancel said parasitic reactances exhibited by said device and its packaging.

* * * * *